United States Patent
Lin et al.

(10) Patent No.: US 10,867,838 B2
(45) Date of Patent: Dec. 15, 2020

(54) SEMICONDUCTOR DEVICE HAVING A SHALLOW TRENCH ISOLATION STRUCTURE AND METHODS OF FORMING THE SAME

(71) Applicant: Taiwan Semiconductor Manufacturing Company, Ltd., Hsinchu (TW)

(72) Inventors: Chun-Li Lin, Hsinchu (TW); Yl-Fang Li, Hemei Township (TW); Geng-Shuoh Chang, Taipei (TW); Chun-Sheng Wu, Hsinchu (TW); Po-Hsiung Leu, Lujhu Township (TW); Ding-I Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 15/958,830

(22) Filed: Apr. 20, 2018

(65) Prior Publication Data
US 2018/0240698 A1 Aug. 23, 2018

Related U.S. Application Data

(62) Division of application No. 14/952,043, filed on Nov. 25, 2015, now Pat. No. 9,953,861.

(Continued)

(51) Int. Cl.
*H01L 21/764* (2006.01)
*H01L 29/06* (2006.01)
(Continued)

(52) U.S. Cl.
CPC ...... *H01L 21/764* (2013.01); *H01L 21/76224* (2013.01); *H01L 21/76289* (2013.01); *H01L 29/0649* (2013.01); *H01L 29/4991* (2013.01)

(58) Field of Classification Search
CPC ............ H01L 21/764; H01L 21/76264; H01L 21/76289; H01L 21/7682;
(Continued)

(56) References Cited

U.S. PATENT DOCUMENTS 5,206,182 A * 4/1993 Freeman ............... H01L 21/764
148/DIG. 151
5,223,450 A * 6/1993 Fujino ............... H01L 21/76224
148/DIG. 116
(Continued)

*Primary Examiner* — Michael M Trinh
(74) *Attorney, Agent, or Firm* — Slater Matsil, LLP

(57) ABSTRACT

A method includes a patterned hard mask layer formed over a substrate. The substrate is etched using the patterned hard mask layer to form a trench therein but leaving at least one elongated portion of the substrate inside the trench. A first isolation layer is formed over the patterned hard mask layer. The first isolation layer fills the trench and covers the at least one elongated portion of the substrate. A portion of the first isolation layer is removed to expose the at least one elongated portion of the substrate. The at least one elongated portion of the substrate is thereafter removed to form a first opening. A second isolation layer is formed over the first opening, the patterned hard mask layer, and the first isolation layer, the second isolation layer sealing the first opening to form an air gap.

20 Claims, 6 Drawing Sheets

Related U.S. Application Data

(60) Provisional application No. 62/084,999, filed on Nov. 26, 2014.

(51) Int. Cl.
 H01L 21/762 (2006.01)
 H01L 29/49 (2006.01)

(58) Field of Classification Search
 CPC ......... H01L 21/76224–76237; H01L 29/4991; H01L 29/0649; H01L 2221/1042
 See application file for complete search history.

(56) References Cited

U.S. PATENT DOCUMENTS

| | | | |
|---|---|---|---|
| 6,406,975 B1 | 6/2002 | Lim et al. | |
| 6,518,144 B2* | 2/2003 | Nitta | H01L 21/76237 438/424 |
| 6,559,026 B1* | 5/2003 | Rossman | C23C 16/402 438/424 |
| 6,921,704 B1 | 7/2005 | Wu et al. | |
| 7,867,870 B2* | 1/2011 | Jang | H01L 21/764 257/244 |
| 8,426,890 B2 | 4/2013 | Wu et al. | |
| 8,603,890 B2* | 12/2013 | Purayath | H01L 21/764 257/E21.573 |
| 9,105,687 B1 | 8/2015 | Dubois et al. | |
| 9,147,730 B2* | 9/2015 | Xie | H01L 29/0692 |
| 9,209,023 B2 | 12/2015 | Wann et al. | |
| 2002/0132448 A1 | 9/2002 | Lim et al. | |
| 2003/0234423 A1* | 12/2003 | Bul | H01L 21/764 257/341 |
| 2005/0176215 A1* | 8/2005 | Jeong | H01L 27/08 438/427 |
| 2005/0194646 A1* | 9/2005 | Inoue | H01L 21/31053 257/374 |
| 2011/0117730 A1* | 5/2011 | Wann | H01L 21/02381 438/479 |
| 2013/0181322 A1* | 7/2013 | Hurwitz | H01L 21/76289 257/522 |
| 2015/0255470 A1* | 9/2015 | Okamoto | H01L 21/764 257/316 |

\* cited by examiner

SEMICONDUCTOR DEVICE HAVING A SHALLOW TRENCH ISOLATION STRUCTURE AND METHODS OF FORMING THE SAME

This application is a division of U.S. patent application Ser. No. 14/952,043 (issued as U.S. Pat. No. 9,953,861), filed on Nov. 25, 2015, entitled "A Semiconductor Device Having a Shallow Trench Isolation Structure and Methods of Forming the Same," which claims the benefit of U.S. Provisional Application Ser. No. 62/084,999, filed on Nov. 26, 2014, entitled "Method for Forming a Semiconductor Device Having a Shallow Trench Isolation Structure," which patent applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Shallow trench isolations (STIs) are commonly used in the fabrication of semiconductor devices to isolate active regions of the semiconductor substrate and/or prevent electrical current leakage between adjacent devices. In STI, one or more trenches may be etched into a surface of the substrate and then filled with a dielectric material, such as silicon dioxide. The dielectric material may help to reduce electrical current leakage between adjacent semiconductor devices within the same trench or across different trenches.

Due to the huge numbers of devices that are present on a semiconductor substrate and the continual increase in the integration density of various electronic components (e.g., transistors, diodes, resistors, capacitors, etc.) by continual reductions in minimum feature size, the space between the devices is getting narrower. Because of this, isolation of the devices from each other is becoming increasingly difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
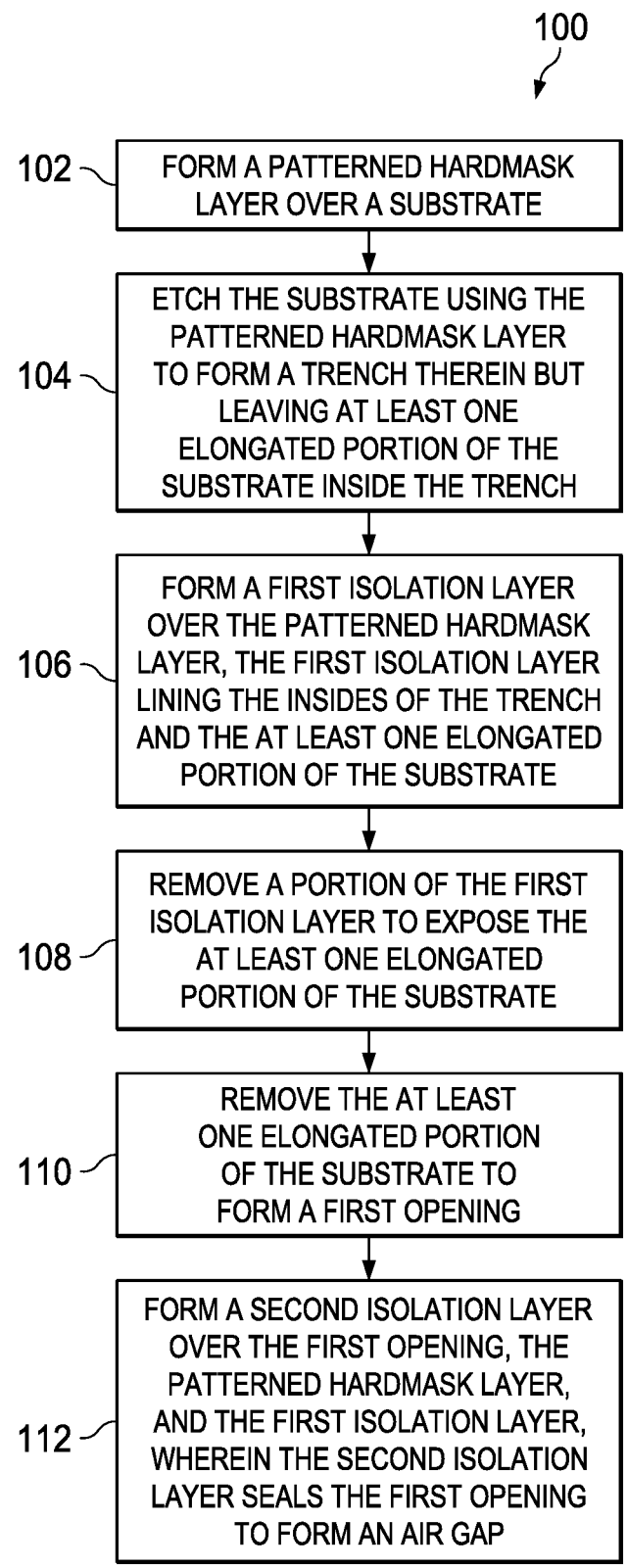
FIG. 1 is a flowchart of a method of forming a shallow trench isolation structure, according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of forming a semiconductor device having a shallow trench isolation structure, according to various aspects of the present disclosure. Referring to FIG. 1, the method 100 includes block 102, in which a patterned hard mask layer is formed over a substrate. The method 100 includes block 104, in which the substrate is etched using the patterned hard mask layer to form a trench in the substrate but leaving behind at least one elongated portion of the substrate inside the trench. The method 100 includes block 106, in which a first isolation layer is formed over the patterned hard mask layer. The first isolation layer fills the trench and covers the at least one elongated portion of the substrate. The method 100 includes block 108, in which a portion of the first isolation layer is removed to expose the at least one elongated portion of the substrate. The method 100 includes block 110, in which the at least one elongated portion of the substrate is removed to form a first opening. The method 100 includes block 112, in which a second isolation layer is formed over the first opening, the patterned hard mask layer, and the first isolation layer. The second isolation layer seals the first opening to form an air gap.

In some embodiments, additional processes are performed before, during, and/or after the blocks 102-112 shown in FIG. 1 to complete the formation of the shallow trench isolation structure, but these additional processes are not discussed herein in detail for the sake of brevity.

FIGS. 2-11 are cross-sectional views of a semiconductor device having a shallow trench isolation structure at various stages of fabrication according to one or more embodiments of the present disclosure. FIGS. 2-11 have been simplified for a better illustration of the concepts of the present disclosure. It should be appreciated that the materials, geometries, dimensions, structures, and process parameters described herein are only illustrative, and are not intended to be, and should not be construed to be, limiting to the present disclosure. Many alternatives and modifications will be apparent to those skilled in the art, once informed by the present disclosure.

Figure 2:
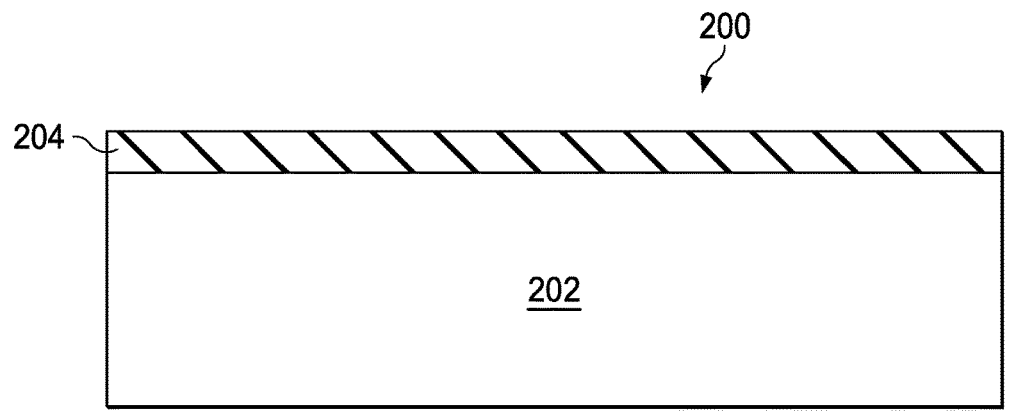
FIGS. 2, 3, 4, 5, 6, 7, 8, 9, 10, and 11 are cross-sectional side views of a shallow trench isolation structure at various stages of fabrication, according to one or more embodiments of the present disclosure.

Referring to FIG. 2, a portion of a semiconductor device 200 having a shallow trench isolation (STI) structure is shown including a hard mask layer 204 formed on a substrate 202. The substrate 202 may be a substrate employed within a microelectronics fabrication including but not limited to integrated circuit microelectronics fabrications, solar cell microelectronics fabrication, and CMOS image sensor (CIS) microelectronics fabrication. The substrate 202 may include a semiconductor substrate made of silicon (Si) or other semiconductor materials and may, or may not be, covered by an insulating layer, for example. The substrate 202 may include active components or circuits, not shown. The substrate 202 may include silicon oxide over single-crystal silicon, for example. The substrate 202 may include conductive layers or semiconductor elements, e.g., transistors, diodes, etc., formed therein. The substrate 202 may be a single-crystalline Si or germanium (Ge) substrate in some embodiments. In other embodiments, the substrate 202 includes silicon germanium, silicon carbide, graphene, or one or more III-V compound semiconductor materials. In some embodiments, the substrate 202 includes Si oriented in a (0,0,1) crystalline orientation, as an example. Compound semiconductors such as GaAs, InP, SiGe, or SiC, as examples, may be used in place of Si or Ge. The substrate 202 may be a bulk substrate or a semiconductor-on-insulator (SOI) substrate, for example. Alternatively, the substrate 202 may include other materials and/or crystalline orientations.

Formed over the substrate 202 is a hard mask layer or barrier layer 204. The hard mask layer 204 may be silicon nitride ($Si_3N_4$). In other embodiments, the hard mask layer 204 may include a nitride, silicon oxynitride material, or a combination thereof. All such combinations are fully intended to be included within the scope of the embodiments. It is understood that the hard mask layer 204 can be formed of any material capable of functioning as a stop layer.

The hard mask layer 204 may be deposited by a chemical vapor deposition (CVD) process such as a low-pressure chemical vapor deposition (LPCVD) process, for example. In an embodiment, the thickness of the hard mask layer 204 that is deposited onto substrate 202 is determined by the permissible amount of chemical mechanical polish (CMP) overpolish in a later process step before active device areas are exposed and/or damaged by polishing. In some embodiments, the hard mask layer 204 is deposited to a thickness of from about 200 Angstroms to about 800 Angstroms. In one exemplary embodiment employing a LPCVD process, the substrate 202 is inserted into a high temperature furnace at a temperature from about 700 degrees Celsius to about 800 degrees Celsius. Inside the process chamber ammonia and dichlorosilane gases react to form a thin layer of silicon nitride (nitride, $Si_3N_4$) on the substrate 202. In some embodiments, the hard mask layer 204 may be deposited onto the substrate 202 by an atmospheric pressure CVD (APCVD) process by reacting silane and ammonia, for example, by a plasma-enhanced chemical vapor deposition (PECVD) process, or an atomic layer deposition (ALD) process. In subsequent processes, as will be described below, the hard mask layer 204 as a durable mask material will serve to protect active regions during an oxide deposition process (see FIG. 5) and to serve as a polish-stop material during the CMP step (see FIG. 6).

Figure 3:
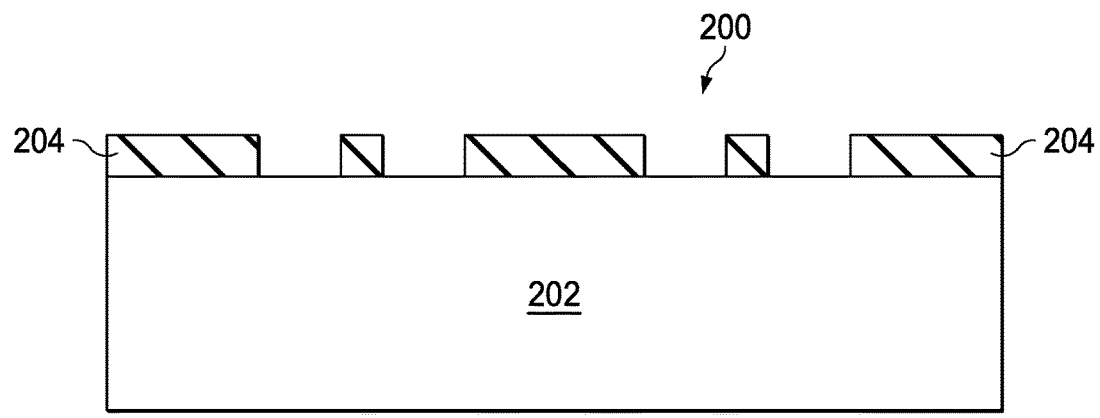

Referring now to FIG. 3, following the formation of the hard mask layer 204, the hard mask layer 204 is then patterned and etched by photolithography techniques to form a patterned hard mask layer 204. Generally, photolithography involves depositing a photoresist layer (not shown) over the hard mask layer 204, which is then masked, exposed, and developed to have openings therein. The openings correspond to locations of shallow trenches. The hard mask layer 204 can be etched by using a variety of etching techniques using different gas chemistries. In one embodiment, the gas chemistry is carbon tetra-fluoride ($CF_4$) that is mixed with $O_2$ and $N_2$. In other embodiments, the hard mask layer 204 may be etched using $SiF_4$, $NF_3$, $CHF_3$, and/or $C_2F_6$ gases.

Figure 4:
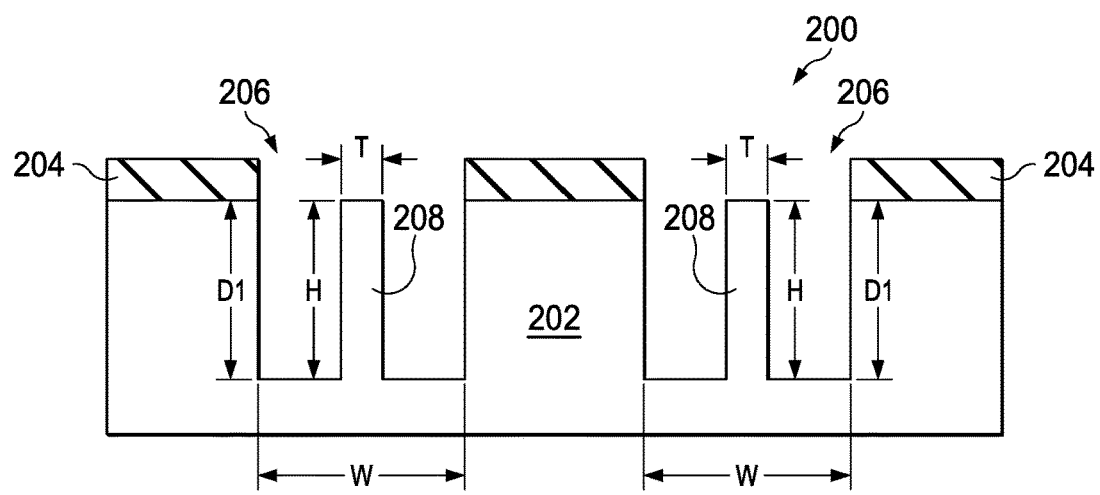
Figure 4A:
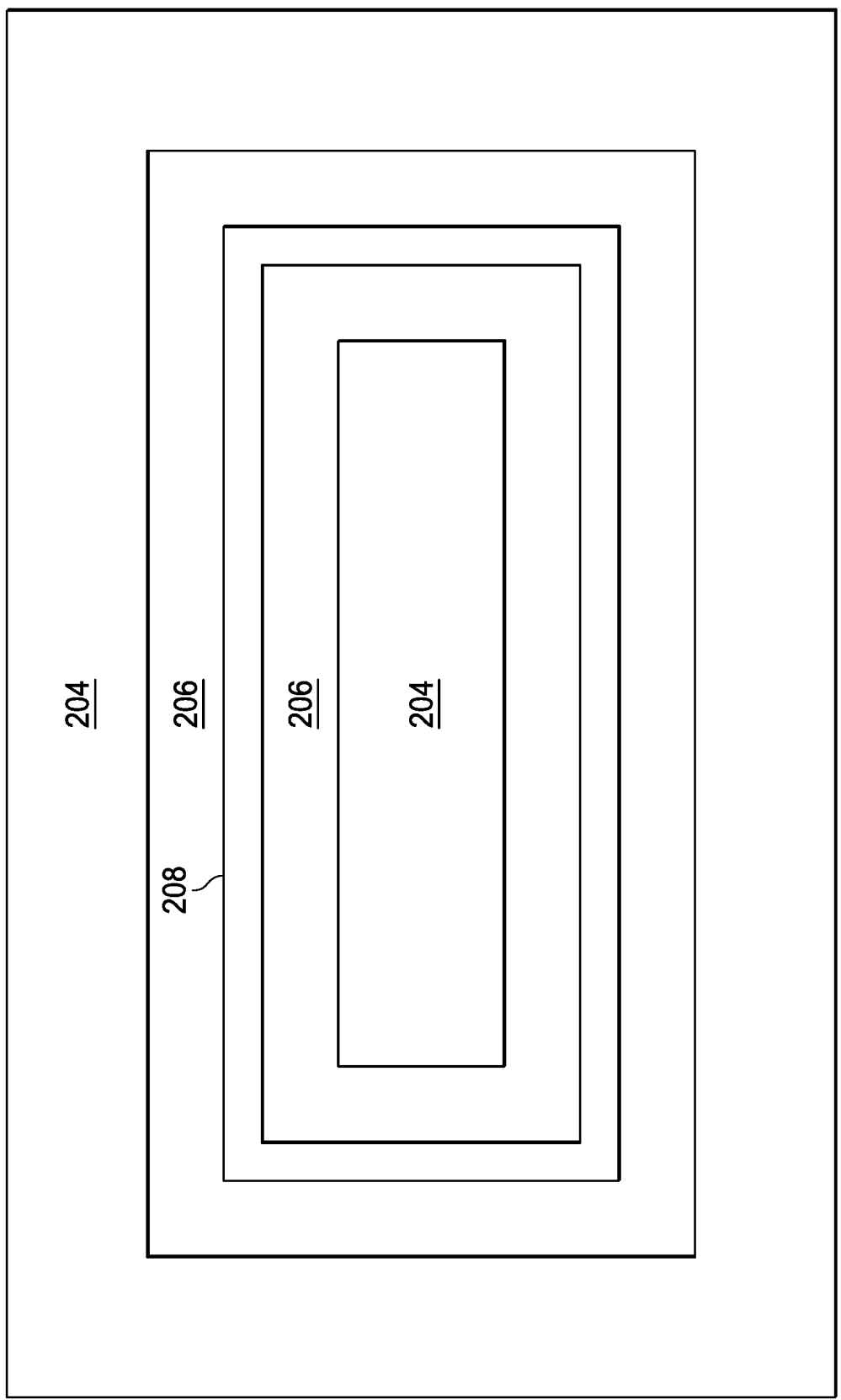
FIG. 4A is a top down view of the structure of FIG. 4, according to one or more embodiments of the present disclosure.

FIG. 4 shows a cross-sectional view of the semiconductor device having STI structure 200 with trenches 206 formed in substrate 202 with at least one elongated portion 208 remaining within each of the trenches 206, and FIG. 4A shows a top down view of the semiconductor device of FIG. 4 showing the elongated portion 208 within trench 206, according to one or more embodiments of the present disclosure. The substrate 202 is etched using the pattern from the patterned hard mask layer 204 to form trenches 206 leaving behind elongated portion 208. The trenches 206 may be formed by a dry or wet, anisotropic or isotropic etch process. According to one embodiment, the trenches 206 are formed by a plasma dry etch process, using for example chlorine ($Cl_2$), bromine, or a combination of chlorine and bromine gas chemistries. According to another embodiment, trenches 206 are formed by a dry etch process, with the etching gas being selected from $CF_4$, $Cl_2$, $NF_3$, $SF_6$, and/or combinations thereof. According to yet another embodiment, the etch process is performed using wet etching, for example, using Tetra-Methyl Ammonium Hydroxide (TMAH), a potassium hydroxide (KOH) solution, or the like, as an etchant. It is understood however, that the trenches 206 may be formed by any of a variety of substrate etching techniques, at a variety of pressures, temperatures, and so forth. In some embodiments, after the trenches 206 are formed in substrate 202, a portion of the hard mask layer 204 remaining on the elongated portion 208 is thereafter removed by a dry etch process. The hard mask layer portions 204 may be removed by a dry etch process, with the etching gas being selected from $CF_4$, $Cl_2$, $NF_3$, $SF_6$, and/or combinations thereof.

Each of the trenches 206 has a depth D1 and a width W. A depth D1 of the trenches 206 are defined as a distance from a bottom of the trenches to the top surface of substrate 202. A width W of trench 206 is defined as a distance from one sidewall of trench 206 to another sidewall. In some embodiments, the trenches 206 have a ratio of depth D1 to width W of 2:1. In other embodiments, the trenches 206 have a ratio of depth D1 to width W of 3:1. It is understood that the trenches 206 may have other depth D1 to width W ratios in other embodiments. In one embodiment, the trenches 206 are etched into the substrate 202 to a depth from about 1,000 Angstroms to about 3000 Angstroms. Both the depth D1 and the width W may be set to a depth and width, respectively that is based on the requirements of semiconductor devices formed on substrate 202 between a pair of shallow trenches. For example, the depth and width of trench 206 may be determined based on device dimensions of the semiconductor devices formed on the substrate between a pair of trenches 206, which may impact device density. Additionally, the depth and width of the trenches 206 may be determined based on current requirements of the semiconductor devices formed on substrate 202 between a pair of trenches 206, with the semiconductor devices used with signal amplifiers being formed on the substrate between a pair of trenches 206 that are deeper than for semiconductor devices used in logic gates, for example. Additionally, semiconductor device properties that may impact the depth D1 and width W of the trenches 206 may include application of the semiconductor device, semiconductor device width/ height ratio (e.g., device geometry), junction voltage, threshold voltage, and so forth. Further still, the depth D1 and width W of the trenches 206 may be determined based on the dimensions of elongated portions 208 and hence the resulting air gaps 213 (see FIG. 11) for controlling current leakage and/or device interference between adjacent devices. In general, the depth D1 and width W of the trenches 206 may be set to values that provide good performance for semiconductor devices and help provide isolation among devices.

Still referring to FIG. 4, a pillar or elongated portion 208 remains within the trenches 206 after the step of etching substrate 202 to form the trenches 206. In later process steps, the trenches 206 will be filled with an oxide material layer and the elongated portion 208 will be etched away to form air gaps 213 (see FIG. 9) for reducing the leakage current and/or device interference between adjacent devices. The air gaps 213 can improve the insulating effect of the STI structure 200, and thus, reduce the leakage current and/or device interference because the dielectric constant of air (e.g. air has k value of about 1.0) is considerably smaller than that of dielectric materials, and thus, the overall dielectric constant of the STI structure will be reduced.

In one embodiment, the semiconductor device having STI structure 200 includes one elongated portion 208 within each trench 206. In some embodiments, the STI structure 200 includes two elongated portions 208 within each trench 206. In other embodiments, the STI structure 200 includes three elongated portions 208 within each trench 206. It is understood by those skilled in the art, however that the STI structure 200 may have any number of elongated portions 208. In some embodiments, the elongated portions 208 are formed substantially in a middle portion of each trench 206. In other embodiments, the elongated portions 208 are formed off-center within each trench 206.

The pillars 208 have a height H and a thickness T. In some embodiments, the pillars 208 have a height H substantially equal to the depth D1 of trench 206. In some embodiments, the pillars 208 have a height H lower than the depth D1 of trench 206. In some embodiments, the pillars 208 have a ratio of height H to thickness T of 2:1. In other embodiments, the pillars 208 have a ratio of height H to thickness T of 6:1. In still other embodiments, the pillars 208 have a ratio of height H to thickness T of 8:1. It is understood that the pillars 208 may have other height H to thickness T ratios in other embodiments.

The height H and thickness T of each pillar 208 are related to the dimension of the resultant air gap 213 (see FIG. 11) that can be selected based on the amount of leakage reduction desired and/or device interference between adjacent devices. For example, the height H and thickness T of the pillars 208 may roughly define the dimensions of the air gaps 213 as the air gaps 213 is formed in the place of the pillars 208 by the removal of the pillars 208. In one embodiment, the pillars 208 each have a height H from about 500 Angstroms to about 3,000 Angstroms and a thickness T from about 100 Angstroms to about 300 Angstroms. In some other embodiments, the pillars 208 each have a height H from about 500 Angstroms to about 1,000 Angstroms and a thickness T from about 100 Angstroms to about 200 Angstroms.

It is appreciated, however, that the values recited throughout the present disclosure are merely examples. Those skilled in the art understand that the trenches 206 and the pillars 208 may have any number of dimensions, with a limit being based on fabrication capability, desired performance gain (e.g., current leakage reduction), achievable performance gain, fabrication cost, fabrication yield, and so forth.

Figure 5:
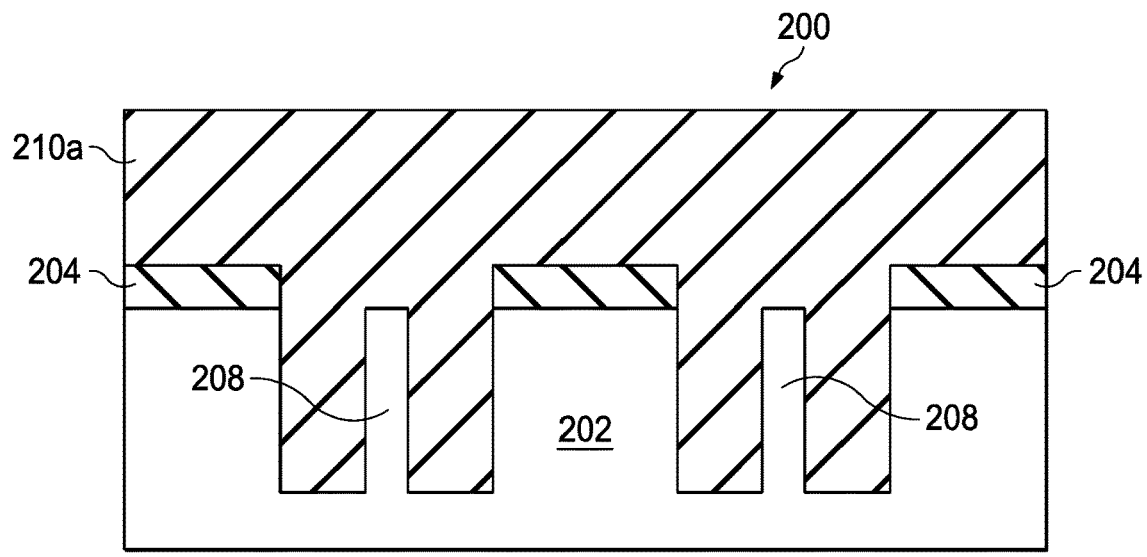

Referring to FIG. 5, following the formation of trenches 206 with elongated portions 208 (pillars 208) therein, a first isolation layer 210a is deposited over the substrate 202 and the STI structure 200 to fill trenches 206 including covering the elongated portions 208 and the hard mask layer 204. In an embodiment, the first isolation layer 210a is an oxide layer such as, for example $SiO_2$, TEOS SiO2, also referred to as an STI oxide. The first isolation layer 210a may be blanket deposited over the substrate 202 and the STI structure 200 by a CVD process such as for example, APCVD, PECVD, high density plasma chemical vapor deposition (HDP-CVD), an ALD process, a flowable CVD (FCVD) (e.g., a CVD-based material deposition in a remote plasma system and post curing to make it convert to another material, such as an oxide), a spin-on process, the like, or a combination thereof. In some embodiments, the first isolation layer 210a is deposited to a thickness from a top surface of the hard mask layer 204 from about 100 Angstroms to about 5,000 Angstroms.

Following deposition of the first isolation layer 210a, an annealing process such as, for example a rapid thermal annealing (RTA) process may be carried out, for example, at temperatures from about 800 degrees Celsius to about 1150 degrees Celsius to increase the density of the oxide and improve its quality.

Figure 6:
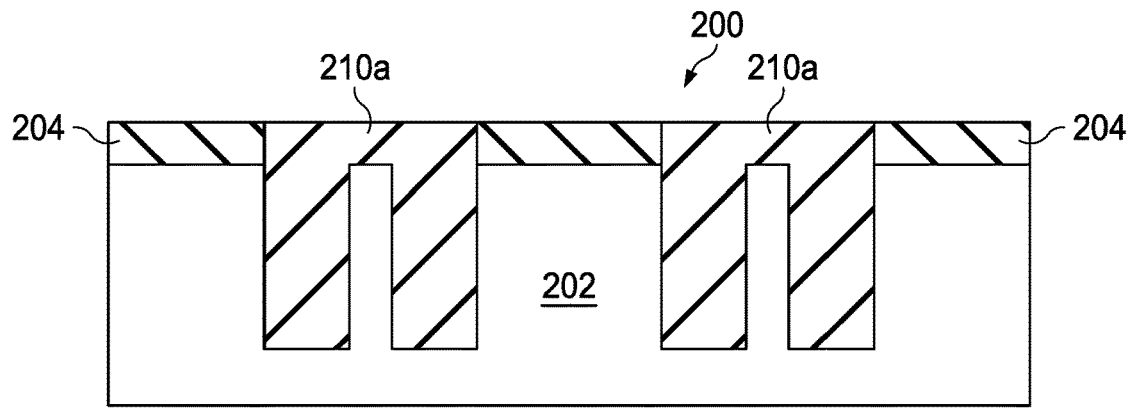

FIG. 6 illustrates the STI structure 200 after a planarization is performed on the first isolation layer 210a and the hard mask layer 204. The planarization process may include, for example, a CMP process, that is carried out to planarize the first isolation layer 210a using the hard mask layer 204 as a polish stop layer. The nitride functions as a polish-stop layer for CMP, with endpoint detection to stop the polish process at the transition from oxide to nitride.

Figure 7:
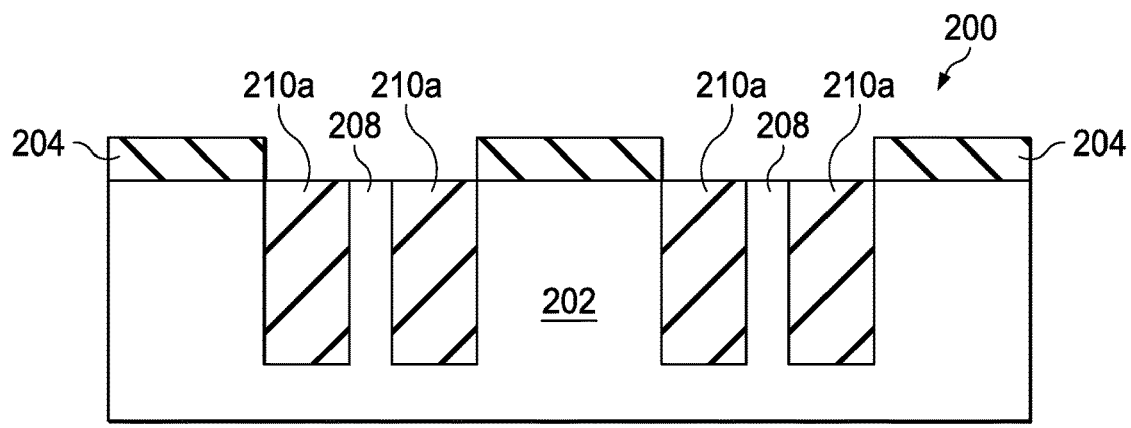

In FIG. 7, portions of the first isolation layer 210a are removed to expose the pillars 208 below. In some embodiments, a wet etch process removes portions of the first isolation layer 210a to expose pillar 208. In some embodiments, the oxide in the first isolation layer 210a is wet etched by hydrofluoric acid (HF). In these embodiments, the selective removal of the oxide is done by spraying or immersing the substrate 202 and the STI structure 200 in a dilute solution of HF that, in some embodiments, is buffered with ammonium fluoride ($NH_4F$), also known as a buffered oxide etch (BOE) or buffered HF (BHF).

Following the removal of portions of the first isolation layer 210a to expose the pillars 208 below, the STI structure 200 undergoes an etch process whereby the pillars 208 are removed to leave first openings 212a, according to one or more embodiments. In an embodiment, the first openings 212a have depths from a top surface of the first isolation layer 210a that are substantially the same as the height H of the removed pillar 208 and thicknesses that are substantially the same as the thickness T of the removed pillars 208. The first openings 212a may have bottom surfaces that are substantially coplanar with a surface of the substrate 202 at the bottom of the trenches 206 (see FIG. 4). The pillars 208 can be removed by a dry or wet etch process. The etchant used to remove pillars 208 may include liquid, gas, or a mixture of liquid and gas. In order to facilitate the formation of air gaps (see FIG. 9), the etching rate of the etchant is relatively high with respect to silicon and relatively low with respect to oxide. In some embodiments, removal of pillars 208 is performed by using a dry etch process, with the etching gas being selected from $CF_4$, $Cl_2$, $NF_3$, $SF_6$, the like, and/or combinations of these. In alternative embodiments, the pillars 208 are removed by using wet etching, for example, using Tetra-Methyl Ammonium Hydroxide (TMAH), a potassium hydroxide (KOH) solution, or the like, as an etchant. In other embodiments, the pillars 208 are removed by a plasma dry etch process, using for example chlorine (Cl$_2$), bromine, or a combination of chlorine and bromine gas chemistries. It is understood, however, that the pillars 208 may be removed by any of a variety of etching techniques and chemistries.

Figure 8:
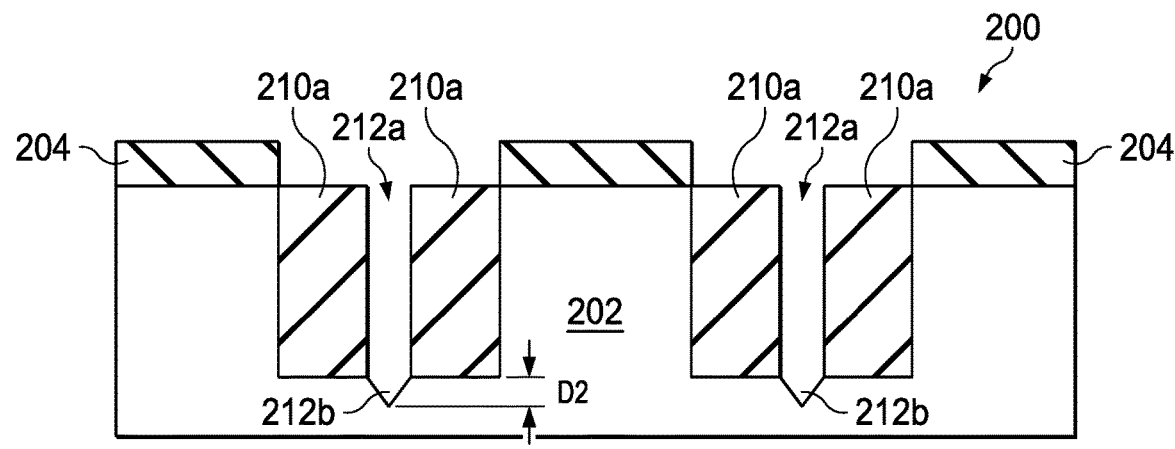

In some embodiments, after the first openings 212a are formed by removing the pillars 208, portions of the substrate 202 below the first openings 212a are selectively removed to form second openings 212b, as shown in FIG. 8. The size and/or depth of the second openings 212b are adjustable by adjusting the etching degree of substrate 202. Different depths D2 of second openings 212b may be used for different semiconductor devices. The use of different depths D2 may allow for optimization of the isolation for different semiconductor devices in an integrated circuit. For instance, depth D2 of second openings 212b can be adjusted based on the amount of leakage reduction desired and/or device interference desired between adjacent devices. In some embodiments, the depth D2 of the second opening 212b can be made larger for devices that desire more reduction of leakage current and/or device interference. For example, for signal amplifiers adjacent the STI structures, the increased depth D2 may reduce the leakage current between the signal amplifiers.

In some embodiments, the second openings 212b have depths D2 in the range from about 20 Angstroms to about 200 Angstroms. In other embodiments, the second openings 212b have depths D2 in the range from about 50 Angstroms to about 100 Angstroms. Other ranges of depths D2 are within the scope of the present disclosure. In some embodiments, the second openings 212b abutting the substrate 202 have substantially rounded profiles. In some embodiments, the second openings 212b abutting the substrate 202 have substantially pointed (V-shape) profiles. For example, the V-shape profile may be formed by the facets produced in the substrate 202 during a wet etch process. In an embodiment, the facets of the substantially pointed profile of the second openings 212b may be along the (1,1,1) plane of the substrate 202, and may have an angle of about 45° relative to the top surface of the substrate 202. In other embodiments, the second openings 212b abutting the substrate 202 may have a substantially rectangular profile, a substantially square profile, a U-shape profile, or an asymmetrical pointed profile, although other profiles are within the scope of the present disclosure.

The second openings 212b can be formed by using either a wet or dry etch process. The etching processes for forming the first openings 212a are essentially the same for forming the second openings 212b, and hence the details of which are not repeated again. In an embodiment, the first openings 212a and the second openings 212b may be formed by a single, continuous etching process, rather than two separate etching processes. In a single etch process embodiment, the first and second openings 212a and 212b may be formed by a wet etch process. In a two etch step process embodiment, the first and second openings 212a and 212b may be formed by a dry etch process step followed by a wet etch process step. It is understood that first openings 212a and/or second openings 212b can be formed prior to the formation of the devices adjacent the STI structure 200 in some embodiments. However, in other embodiments, first openings 212a and/or second openings 212b can be formed after the formation of these devices.

Figure 9:
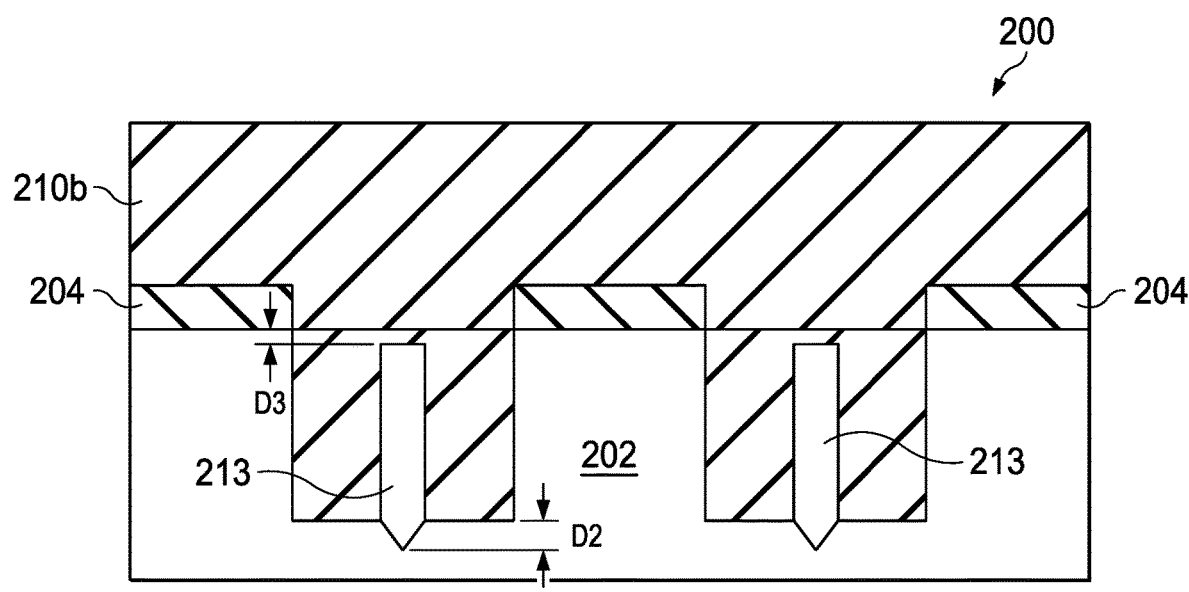

Referring now to FIG. 9, following the formation of first and second openings 212a and 212b, respectively, a second isolation layer 210b is deposited over the first and/or second openings 212a, 212b, the hard mask layer 204, and the first isolation layer 210a. The second isolation layer 210b seals the first openings 212a and/or the second openings 212b to form air gaps 213 in the trenches 206. In an embodiment, a top surface of the air gaps 213 is below the top surface of the substrate 202 by a depth D3. The depth D3 may be controlled by the deposition rate of the second isolation layer 210b such that a higher deposition rate may result in a smaller depth D3 and a lower deposition rate may result in a larger depth D3. In an embodiment, the first isolation layer 210a and the second isolation layer 210b have a same material composition such that than an interface between the layers 210a and 210b may be difficult to detect after layer 210b is formed. In some embodiments, one or more air gaps 213 can be formed in the STI structure 200. In an embodiment, the profile of the air gaps 213 as viewed in the cross-sectional plane of FIG. 9 is substantially rectangular. Because the dielectric constant of air is considerably smaller than that of dielectric materials, the air gaps 213 decrease the dielectric constant of the STI structure 200 improving the insulating effect of the STI structure, and thus, reducing the leakage current between adjacent devices.

In an embodiment, the second isolation layer 210b includes an oxide layer such as, for example SiO$_2$, TEOS SiO$_2$, also referred to as an STI oxide. The second isolation layer 210b may be blanket deposited over the substrate 202 and the STI structure 200 by a CVD process such as for example, APCVD, PECVD, HDP-CVD, an ALD process, a FCVD process, a spin-on process, the like, or a combination thereof. In an embodiment, the second isolation layer 210b is deposited with a high deposition rate process such as APCVD, PECVD, HDP-CVD, the like, or a combination thereof. In some embodiments, the second isolation layer 210b is deposited to a thickness from about 100 Angstroms to about 5,000 Angstroms as measured from the top surface of the hard mask layer 204. The disclosed thickness range of the second isolation layer 210b allows for a proper process control window for a subsequent planarization process (see FIG. 10) performed on the second isolation layer 210b.

Following deposition of the second isolation layer 210b, an annealing process such as, for example a rapid thermal annealing (RTA) process may optionally be carried out, for example, at temperatures from about 800 degrees Celsius to about 1150 degrees Celsius to increase the density of the oxide of first and second isolation layers 210a and 210b and improve their quality.

Figure 10:
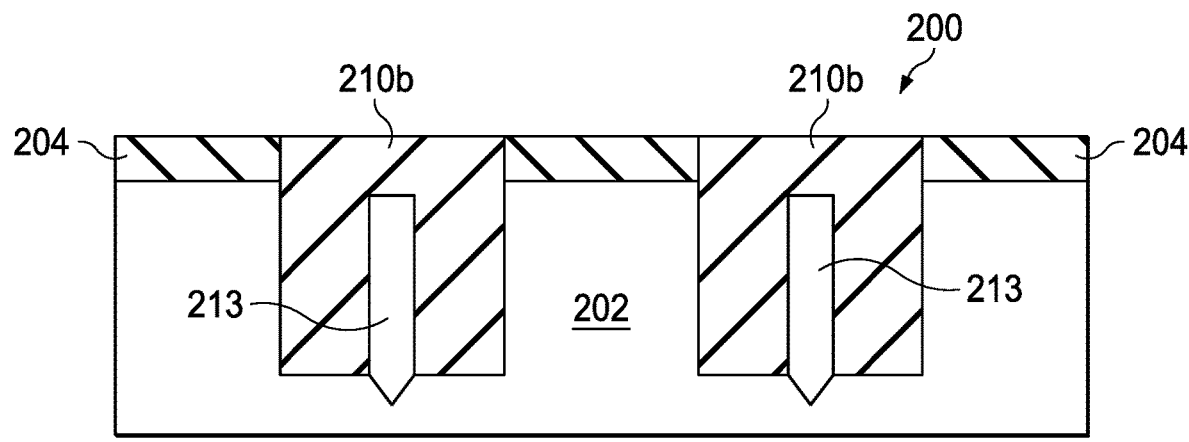

FIG. 10 illustrates the STI structure 200 after a planarization is performed on the second isolation layer 210b and the hard mask layer 204. The planarization process may include, for example, a CMP process, that is carried out to planarize the second isolation layer 210b using the hard mask layer 204 as a polish stop layer. The nitride of the hard mask layer 204 functions as a polish-stop layer for CMP, with endpoint detection to stop the polish process at the transition from oxide (e.g. layer 210b) to nitride (e.g. layer 204).

Figure 11:
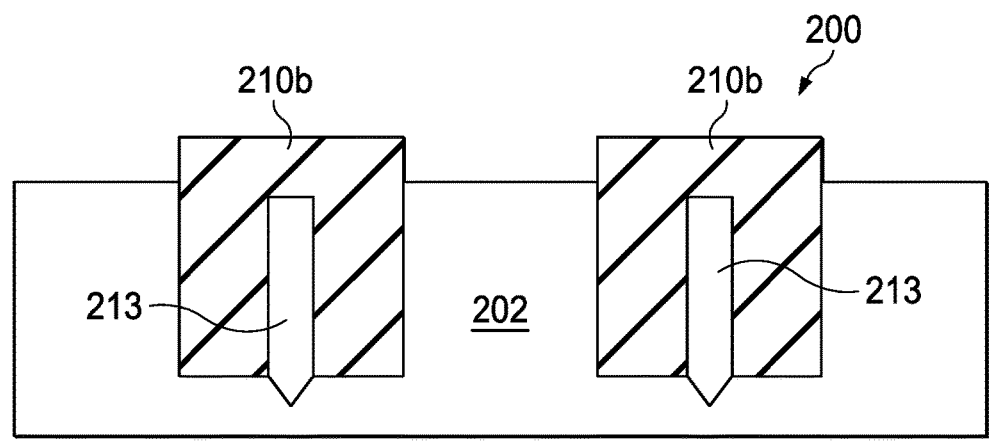

Following the planarization of the second isolation layer 210b, the patterned hard mask layer 204 is removed to expose the substrate 202 surface as shown in FIG. 11. The removal of the hard mask layer 204 results in the second isolation layer 210b of the STI structure 200 extending above the top surface of the substrate 202. In some embodiments, the patterned hard mask layer 204 is removed by a wet etch process. In one exemplary embodiment, the wet etch process uses a heated $H_3PO_4$ aqueous solution. The process includes contacting the hard mask layer 204 with the heated $H_3PO_4$ aqueous solution by dipping the substrate 202 and the STI structure 200 into one or more wet etching baths of heated phosphoric acid wet etching solution (e.g., $H_3PO_4$) heated from about 150 degrees Celsius to about 175 degrees Celsius. In some embodiments, the patterned hard mask layer 204 is removed by a wet etch process including a hydrofluoric acid (HF) solution. In other embodiments, the patterned hard mask layer 204 can be removed by a wet etch process employing the chemistries APM, SPM, DHF.

The semiconductor device having the STI structure 200 shown in FIGS. 2-11 are only for illustrative purpose and are not limiting. It should be understood that the ordering of the various steps discussed above with reference to FIGS. 2-11 are provided for illustrative purposes, and as such, other embodiments may utilize different sequences. These various ordering of steps are to be included within the scope of embodiments. Additional embodiments can also be conceived.

Also, further processes may be used to complete the fabrication and packaging of the semiconductor device. For example, inter-layer dielectrics and metal layers may be formed and patterned, other circuitry may be formed, the wafer may be diced and packaged, and the like.

Advantages of one or more embodiments of the present disclosure may include one or more of the following.

In one or more embodiments, the use of different air gap depths extending below a bottom surface of a shallow trench isolation structure may allow for optimization of the isolation for different semiconductor devices in an integrated circuit.

In one or more embodiments, air gap depths can be adjusted based on the amount of leakage reduction desired and/or device interference required between adjacent devices. For example, signal amplifier devices may require more reduction of leakage current and/or device interference than logic gate devices such that the air gaps can be designed to extend further below the bottom surfaces of the STI structures for the signal amplifiers than the air gaps in STI structures for the logic gate devices.

In one or more embodiments, the use of an air gap in a shallow trench isolation structure decreases the dielectric constant of the shallow trench isolation structure (e.g. air has a smaller dielectric constant than typical dielectric materials), and thus, improves the insulating effect between adjacent devices.

Various aspects of the present disclosure have been described. According to one aspect of this disclosure, a method includes patterned hard mask layer is formed over a substrate. The substrate is etched using the patterned hard mask layer to form a trench therein but leaving at least one elongated portion of the substrate inside the trench. A first isolation layer is formed over the patterned hard mask layer. The first isolation layer fills the trench and covers over the at least one elongated portion of the substrate. A portion of the first isolation layer is removed to expose the at least one elongated portion of the substrate. The at least one elongated portion of the substrate is thereafter removed to form a first opening. A second isolation layer is formed over the first opening, the patterned hard mask layer, and the first isolation layer, the second isolation layer sealing the first opening to form an air gap.

According to another aspect of this disclosure, a method for forming a shallow trench isolation (STI) structure is provided. The method includes a barrier layer formed over a substrate. The barrier layer is etched to form a mask layer. The substrate is etched using the mask layer to form at least a first trench and a second trench, wherein an elongated portion of the substrate separates the first trench from the second trench. A first oxide layer is formed over the mask layer and the elongated portion of the substrate. The first oxide layer lines the bottoms and sidewalls of the first and second trenches. A portion of the first oxide layer is etched away to expose the elongated portion of the substrate. The elongated portion of the substrate is thereafter removed to form a first opening. A portion of the substrate below the first opening is etched away to form a second opening. A second oxide layer is formed over the first and second openings, the mask layer, and the first oxide layer, the second oxide layer sealing the first and second openings to form an air gap.

According to yet another aspect of this disclosure, a semiconductor structure includes a trench formed in a substrate. An insulation layer filling the trench. One or more elongated air gaps are formed the trench, the one or more elongated air gaps extending down into a portion of the substrate.

According to another aspect of this disclosure, one embodiment is a semiconductor structure including a substrate having a device region formed therein. The structure also includes an insulating structure disposed in the substrate, where the insulating structure surrounds the device region. An air gap is disposed within the insulating structure, where the air gap separates a first leg of the insulating structure from a second leg of the insulating structure and has a portion extending into the substrate.

According to another aspect of this disclosure, another embodiment is a semiconductor device including a semiconductor substrate and an insulating region surrounding a device region of the semiconductor substrate. A first portion of the insulating region includes a first insulating structure disposed in a lengthwise direction parallel to a first side of the device region of the substrate and a second insulating structure disposed in a lengthwise direction parallel to the first insulating structure. The first insulating structure and the second insulating structure are separated by an air gap disposed in a lengthwise direction parallel to the first insulating structure and the second insulating structure.

According to yet another aspect of this disclosure, another embodiment is an isolation structure including a first leg and a second leg of an isolation material, where the first leg is disposed in a semiconductor substrate lengthwise adjacent to a first side of a device area of the substrate. The second leg is parallel to the first leg, where a top portion of the first leg is coupled to a top portion of the second leg by the isolation material. The isolation structure also includes an air gap disposed between the first leg and the second leg.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a device region disposed in a substrate, the substrate comprising a semiconductor material;

an insulating structure disposed in the substrate, the insulating structure surrounding the device region, the insulating structure comprising an insulating material, sidewalls of the insulating structure extending vertically from the substrate higher than an uppermost surface of the substrate; and an air gap disposed within the insulating structure, the air gap separating a first leg of the insulating structure from a second leg of the insulating structure, the air gap having a portion extending into the substrate, the air gap having sidewall surfaces and an upper surface comprising the insulating material, the air gap having a bottom surface comprising the semiconductor material of the substrate, wherein the first leg of the insulating structure has a uniform first width between a vertical first sidewall surface of the air gap and a vertical interface with the substrate, the uniform first width of the first leg extending between the upper surface of the air gap and an bottom interface with the substrate.

2. The semiconductor structure of claim 1, wherein the portion of the air gap extending into the substrate extends into the substrate by a distance of about 20 Angstroms to about 200 Angstroms.

3. The semiconductor structure of claim 1, wherein the air gap has an elongated profile.

4. The semiconductor structure of claim 1, wherein the air gap has a substantially rectangular profile.

5. The semiconductor structure of claim 1, wherein the portion of the air gap extending into the substrate has a substantially pointed profile therein.

6. The semiconductor structure of claim 1, wherein the air gap has a topmost surface which is disposed below a top surface of the substrate.

7. The semiconductor structure of claim 1, wherein the air gap has a first lengthwise direction parallel to the device region of the substrate.

8. The semiconductor structure of claim 7, wherein the air gap has a second lengthwise direction parallel to the device region of the substrate, wherein the first lengthwise direction is perpendicular to the second lengthwise direction.

9. The semiconductor structure of claim 8, wherein the air gap in the first lengthwise direction is a first air gap and the air gap in the second lengthwise direction is a second air gap, and wherein the first air gap continuously extends to the second air gap.

10. A semiconductor device comprising:
a device region of a semiconductor substrate; and
an insulating region surrounding the device region, the insulating region comprising:
a first insulating structure disposed in a lengthwise direction parallel to a first side of the device region of the semiconductor substrate,
a second insulating structure disposed in a lengthwise direction parallel to the first insulating structure,
a third insulating structure disposed over and contacting an upper surface of the first insulating structure and an upper surface of the second insulating structure, and
an air gap interposed between the first insulating structure and the second insulating structure, wherein a width of the third insulating structure equals a combined width of the first insulating structure, the second insulating structure, and the air gap, wherein a first sidewall of the air gap comprises the first insulating structure, a second sidewall of the air gap comprises the second insulating structure, an upper surface of the air gap comprises the third insulating structure, and a bottom surface of the air gap comprises the semiconductor substrate.

11. The semiconductor device of claim 10, wherein the air gap has a bottom surface extending below a bottommost surface of the first insulating structure.

12. The semiconductor device of claim 10, wherein an upper surface of the third insulating structure extends vertically higher than an uppermost surface of the semiconductor substrate.

13. The semiconductor device of claim 10, wherein a width of the first insulating structure is greater than a width of the air gap.

14. The semiconductor device of claim 10, wherein a first height is a height of the first insulating structure, wherein a ratio of the first height to the width of the third insulating structure is 2:1 to 3:1.

15. An isolation structure comprising:
a first leg, the first leg comprising an isolation material, wherein the first leg is disposed in a semiconductor substrate, wherein the first leg is disposed lengthwise adjacent to a first side of a device area of the semiconductor substrate;
a second leg, the second leg comprising the isolation material, wherein the second leg is parallel to the first leg;
a top cap, the top cap comprising the isolation material, a bottom surface of the top cap contacting an upper surface of the first leg and an upper surface of the second leg, wherein outer sidewalls of the top cap are aligned to outer sidewalls of the first leg and the second leg; and
an air gap interposed between the first leg and the second leg, the air gap enclosed between a bottom surface comprising the semiconductor substrate and a top surface comprising the top cap, the air gap having a first height between the top surface and the bottom surface, wherein a first width is a combined width of the first leg, the second leg, and the air gap, wherein a ratio of the first height to the first width is between 2:1 and 3:1, inclusive, wherein the first height is between 500 Å and 3000 Å, wherein the first width is between 1000 Å and 3000 Å, and wherein a width of the air gap is between 100 Å and 300 Å.

16. The isolation structure of claim 15, wherein the air gap has a bottommost point lower than a bottom surface of the first leg.

17. The isolation structure of claim 15, wherein the first leg, second leg, and air gap extend to a second side of the device area, wherein the second side of the device area is perpendicular to the first side of the device area.

18. The isolation structure of claim 15, wherein the top cap has a top surface which protrudes above a top surface of the semiconductor substrate.

19. The isolation structure of claim 15, wherein a width of the first leg is greater than a width of the air gap.

20. The isolation structure of claim 15, wherein the air gap has a second height as measured from a bottom of the first leg to the upper surface of the first leg, wherein the air gap has a second width, wherein a ratio of the second height to the second width is between 6:1 and 8:1, inclusive.

* * * * *

UNITED STATES PATENT AND TRADEMARK OFFICE
CERTIFICATE OF CORRECTION

| | | |
|---|---|---|
| PATENT NO. | : 10,867,838 B2 | Page 1 of 1 |
| APPLICATION NO. | : 15/958830 | |
| DATED | : December 15, 2020 | |
| INVENTOR(S) | : Chun-Li Lin | |

It is certified that error appears in the above-identified patent and that said Letters Patent is hereby corrected as shown below:

On the Title Page

Item (72) Inventors, Line 1, delete "Yl-Fang" and insert --Yi-Fang--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*